United States Patent
Wyler et al.

(10) Patent No.: US 6,401,807 B1
(45) Date of Patent: Jun. 11, 2002

(54) FOLDED FIN HEAT SINK AND FAN ATTACHMENT

(75) Inventors: Gregory T. Wyler, Ipswich; Peter B. Favini, Fitchburg, both of MA (US); Blaine C. Wotring, Derry, NH (US); Bibek Chapagain, Newton, MA (US)

(73) Assignee: Silent Systems, Inc., Burlington, MA (US)

( * ) Notice: Subject to any disclaimer, the term of this patent is extended or adjusted under 35 U.S.C. 154(b) by 0 days.

(21) Appl. No.: 09/054,271

(22) Filed: Apr. 2, 1998

Related U.S. Application Data
(60) Provisional application No. 60/042,498, filed on Apr. 3, 1997, and provisional application No. 60/078,210, filed on Mar. 16, 1998.

(51) Int. Cl.$^7$ .................................................. H05K 7/20
(52) U.S. Cl. ..................... 165/121; 165/80.3; 165/185; 174/16.3; 257/722; 257/719; 361/697; 361/704
(58) Field of Search ............................... 165/80.3, 185; 174/16.3; 257/718, 719, 722; 361/697, 704

(56) References Cited

U.S. PATENT DOCUMENTS

| | | | |
|---|---|---|---|
| 1,830,375 A | * 11/1931 | Shoop ..................... 165/183 X |
| 2,772,382 A | * 11/1956 | Escoffery ............... 165/80.3 X |
| 3,449,172 A | * 6/1969 | Dingwall .................... 165/185 |
| 4,778,004 A | * 10/1988 | Paulman et al. ......... 165/152 X |
| 5,201,866 A | * 4/1993 | Mok ......................... 165/80.3 |
| 5,208,731 A | 5/1993 | Blomquist |
| 5,304,846 A | * 4/1994 | Azar et al. ................... 257/722 |
| 5,309,983 A | 5/1994 | Bailey ....................... 165/80.3 |
| 5,329,426 A | 7/1994 | Villani |
| 5,335,722 A | * 8/1994 | Wu ............................. 165/122 |
| 5,365,402 A | * 11/1994 | Hatada et al. .......... 361/704 X |
| 5,367,433 A | 11/1994 | Blomquist |
| 5,371,652 A | 12/1994 | Clemens et al. |
| 5,381,041 A | 1/1995 | Harmon |
| 5,381,305 A | 1/1995 | Harmon et al. |
| 5,436,798 A | 7/1995 | Wieland, Jr. |
| D361,317 S | 8/1995 | Harmon et al. |
| D361,986 S | 9/1995 | Harmon |
| 5,448,449 A | 9/1995 | Bright et al. |
| 5,452,181 A | * 9/1995 | Hoover ....................... 361/697 |
| 5,484,013 A | * 1/1996 | Morikawa et al. ......... 165/80.3 |
| 5,494,098 A | 2/1996 | Morosas ..................... 165/121 |
| 5,495,392 A | * 2/1996 | Shen .......................... 361/697 |
| 5,509,465 A | 4/1996 | Lai |
| 5,562,146 A | 10/1996 | Harmon et al. |
| 5,576,933 A | 11/1996 | Campanella et al. |
| D376,349 S | 12/1996 | Campanella et al. |
| 5,581,442 A | 12/1996 | Morosas |
| 5,594,623 A | * 1/1997 | Schwegler ................... 361/697 |
| 5,609,202 A | 3/1997 | Anderson et al. .......... 165/80.3 |
| 5,615,998 A | * 4/1997 | Kodama et al. ........ 361/697 X |
| 5,678,627 A | * 10/1997 | Lee ............................ 165/80.3 |
| 5,706,169 A | * 1/1998 | Yeh ........................ 361/697 X |
| 5,724,228 A | * 3/1998 | Lee ............................ 361/697 |
| 5,725,047 A | * 3/1998 | Lopez ....................... 165/76 X |
| 6,131,646 A | * 10/2000 | Kelley ................... 165/80.3 X |

FOREIGN PATENT DOCUMENTS

| | | | |
|---|---|---|---|
| EP | 706 212 | 4/1996 | ................. 257/722 |
| EP | 809 298 | 11/1997 | ................. 165/121 |

* cited by examiner

*Primary Examiner*—Leonard Leo
(74) *Attorney, Agent, or Firm*—Bromberg & Sunstein LLP

(57) ABSTRACT

A folded fin heat sink to be clamped onto circuit components in need of cooling, in particular CPU's. Ridges are designed to optimize air flow. Suitable for use with a fan to force air movement.

29 Claims, 14 Drawing Sheets

VIEW A-A
SCALE: NONE

FOLDED FIN HEAT SINK AND FAN ATTACHMENT

The present application claims priority from pending U.S. Provisional Application No. 60/042,498, filed Apr. 3, 1997 and U.S. Provisional Application No. 60/078,210 filed Mar. 16, 1998, the full disclosures of which are hereby incorporated by reference herein.

BACKGROUND OF THE INVENTION

The present invention relates generally to cooling devices, in particular, heat sinks for integrated circuit chips such as central processing units (CPU).

Cooling of electronic devices has become one of the major limiting factors in the performance of such devices. In particular, the central processing unit in a typical personal computer can generate up to 40 watts of heat in an area of less than 4 square inches. The performance of the chip is dictated to a large extent by its speed and the higher the speed, the more heat that is created. The more heat that is created, the slower Ad the chip runs and the shorter the life span of the chip.

Noise is also a major factor in the electronics area. Especially as electronic systems with CPU's are used more frequently inside the home, the desirability of a quiet system has become more prevalent. A typical method for cooling integrated circuit chips involves one or more air moving devices, e.g. fans, used to circulate cool air through the chip area or an attached heat sink. The more heat that is generated, the more air that has to be circulated. As larger and more rapidly moving fans are installed, the more noise that is generated.

Another aspect of computer systems involves the amount of space taken up by the electronic devices within the system. The tradeoff faced is that as a heat sink has a larger surface area, the more efficiently it will cool an attached device. It is highly desirable to provide a heat sink with a high surface area that can take up less space within a computer system and require a less powerful fan for circulating air therethrough to achieve the desired cooling.

Weight is also an issue with computer components. An extruded heat sink is a solid mass of aluminum and in many personal computer systems, in particular, those with an Intel Pentium Pro™ chip, the heat sink exceeds a quarter pound. As these processing chips change location from board mounts to cartridges, the weight becomes even more of a concern. For example, Intel limits the acceptable weight of a heat sink for its latest chip called Klamath to ½ pound (250 grams). This extra weight creates a need for extra mounting force using screws and in many cases extra support beams for the heat sink itself. Without the extra support and mounting force, these heavy heat sinks may dislodge themselves during shipping.

In the manufacture of personal computers, typically multiple fans are used which create noise. Also a heat sink is required for individual chips. The vast majority of these heat sinks are made from extruded aluminum. The aluminum is extruded into a design where thick fins run the length of the extrusion. The extrusion is designed to have a flat plane on the bottom which contacts the semiconductor device. To further increase the surface area of these fins, manufacturers typically "crosscut" through the thick fins in a costly machining process which creates separate pins along the extrusion. Each of these pins has at least four sides of surface area, twice as much as the straight thick fin previous to the crosscut. Extruded aluminum heat sinks face severe limitations. The height of the fin can only be a few times the gap of the distance between the fins because of the extrusion process, and the thickness of the fins is limited by the height because in typical extrusion processes the thickness at the base of the extrusion must be at least ⅕ of the height. Therefore, the higher the fin density for a given area, the shorter the fin height. The highest total surface area achievable for an extruded heat sink with crosscuts in a volume less than ½" high and 4 sq. inches in area usually tops out at about 25 sq. inches. The amount of fins per inch is limited by the thickness and the height. This limitation on density of fins on an extrusion reduces the efficiency of the heat removal.

To make up for this limitation in density that extrusions have, an extrusion being used for a heat sink goes through many secondary operations after it is extruded. First, in many instances the base of the heat sink is machined for flatness in order to make smooth contact with the heat producing substrate it is attached to. Then the bars of extrusion which are typically 8 feet in length are cut down to a particular size, usually 2 inches for a typical semiconductor. The next step is the crosscutting step. After this, the heat sink is usually stamped in order to form mounting holes and locations and then it is anodized and deburred. In all, making an extrusion is an expensive and lengthy process.

U.S. Pat. No. 5,329,426 (Villani) is an example of a method that may be used to attach such an extrusion directly to a heat generating chip carrier. A spring is used to clip the solid heat sink to a pair of braces supporting the chip carrier package.

As the integrated circuit chips have become faster and hotter, the simple extruded heat sink was not sufficient. Manufacturers have added fans or other air-moving devices to these extruded heat sinks. The fan which generally includes its own housing, is screwed onto the top of the extrusion and forces air through the fins. The fan typically adds about an extra half inch to the total height of the extrusion. Due to the constraints within the typical computer system limiting the total height of the heat dissipation elements along the CPU to about one inch, the extruded heat sink portion is thus limited to a total of ½" in fin height. To increase the cooling of the CPU, the fan speed has had to be increased to blow more air through the extrusion. The more air passing over a surface, the higher the thermal conductivity because air is pulling away the heat more quickly. Higher air flow is subject to diminishing returns, however, in that doubling the air velocity fails to double the thermal conductivity of the surface. Fans of the 40 mm. style, typically used for CPU heat sinks in a personal computer, spin at speeds as high as 10,000 RPM's. This high speed creates well over 30 dB's of noise. Reducing the fan speed will reduce the noise level, but also reduces the performance of the heat sink.

To overcome some of the limitations of extruded aluminum, some manufacturers have turned their attention to folded fin aluminum. A Taiwanese product made by TUV S.A. and called the CPU Cooler has been seen for sale in the United States. The CPU Cooler uses a strip of folded fin aluminum bonded onto a square thermally conductive base adjacent one edge thereof. On top of the base alongside the folded fin aluminum is a fan for directing air horizontally across the base and through the folded fins. The product recommends the use of thermal tape or thermal grease to adhere the thermally conductive base onto the top of a CPU.

U.S. Pat. No. 5,494,098 (Morosas) describes a heat sink with a fan mounted over folded fin aluminum. The process for making this heat sink involves a number of costly steps including brazing the folded fin to fix it to a solid block of aluminum and milling the top portions of the fixed fins to provide openings into the channels formed by the fins.

SUMMARY OF THE INVENTION

Embodiments of the present invention are directed to using clamping methods to secure folded fin to a thermally conductive plate to make a heat sink assembly and related fan assemblies. A sheet of aluminum or other heat conductive material is folded into a wave-like pattern forming an alternating series of ridges and troughs (grooves). The folded fin may be used for placement directly on a substrate to be cooled or on a separate conductive base plate to form a heat sink assembly. Where openings in the ridges of the folded fin heat sink are desired, a method for making such a folded fin heat sink involves providing a thermally conductive sheet with holes spaced periodically, folding the thermally conductive sheet to form the ridges and grooves such that the holes appear in the tops of the ridges and clamping the folded thermally conductive sheet to a thermally conductive surface.

The heat sink of an embodiment of the invention includes a thermally conductive sheet folded into at least one set of alternating ridges or grooves. A clamp mechanism is included for forcing the folded conductive sheet against a thermally conductive plate. Increased thermal efficiency can be provided by including openings through a plurality of the ridges on top of the thermally conductive folded sheet. The clamp mechanism includes an abutment portion for pushing the folded thermally conductive sheet against the plate. The abutment portion may be positioned to press against the ridges or the troughs of the folded conductive sheet. The clamp may include a tab that latches beneath the plate to hold the folded sheet clamped against the plate. The clamped heat sink assembly is further provided with an ability to be clamped to a substrate to be cooled. In one embodiment, spring clips are provided for forcing the thermally conductive plate of the heat sink assembly against the substrate to be cooled. Other mechanical clamping mechanisms may be used for attaching the heat sink assembly to the substrate. For example, the tab that clamps the folded fin to the thermally conductive plate can double as the clamp to the substrate. The tab may be provided with an additional bent portion that can be devoted to making the attachment to a substrate to be cooled.

In accordance with an embodiment of a heat sink-assembly of the invention, a cap may be used to clamp the thermally conductive sheet onto the plate. The cap may include an appendage projecting down from the housing and a flange (tab) on the appendage for latching beneath the edge of the plate. An abutment member may be included in the cap for pressing against the tops of a plurality of ridges in the thermally conductive sheet. Furthermore, a compressible gasket may be included between the abutment member and the top of the thermally conductive sheet to insure that clamping pressure is applied to substantially all of the ridges on the sheet. The clamp advantageously enhances the thermal conductivity between the thermally conductive sheet and the plate beneath the sheet.

In accordance with a still further embodiment of a heat sink assembly of the invention, the clamping device is a spring mechanism which applies pressure to the troughs of the folded fin. A plurality of tabs depending from the spring mechanism may be forced into latching engagement beneath an edge of the base plate to tension the spring to press the folded fin against the plate. When the base plate forms a separate heat sink assembly, the assembly is then attached to a substrate to be cooled with the base plate against the substrate. The spring for use in this embodiment of the invention may include a plurality of parallel linkages. Each linkage fits into one of the troughs of the folded fin. In the embodiment, a pair of crossbars are connected, perpendicular to the linkages, to opposite ends of the linkage. Applying pressure to the crossbars moves the tabs until they hook beneath the base plate. Placing the assembled heat sink onto a substrate to be cooled, the tabs can be pushed further until they engage the substrate. According to an embodiment of the heat sink, the base plate has notches which in combination with the tabs of the spring serve to lock the folded fin onto the base plate in three dimensions.

A method for making a heat sink assembly of the invention involves folding a thermally conductive sheet to form alternating ridges on top and troughs on the bottom. A clamp mechanism is placed on the folded thermally conductive sheet. The folded thermally conductive sheet is clamped to a thermally conductive plate forcing the bottom of the folded thermally conductive sheet against the thermally conductive plate to form a clamped heat sink assembly. The heat sink assembly is attached to a substrate to be cooled with the thermally conductive plate in contact with the substrate.

Heat dissipation can be further enhanced by moving air through a heat sink. A heat sink assembly may be arranged so that the fan may be mounted on top of the heat sink while maintaining the entire heat sink apparatus within the footprint of the integrated circuit chip to be cooled. Such an air moving device may be mounted within a cap of the heat sink assembly. In applications where space limitations are more liberal, a cooling fan assembly of the present invention may be used. The cooling fan assembly includes an air moving device, such as a fan, mounted in an opening of a housing. The housing mounts to a heat sink so that the air moving device directs air at the heat sink. The housing includes a baffle which obstructs a portion of the direct air path from the air moving device. The baffle extends over all of the air channels formed by the folded fin. Air moves around the baffle into the channels and then behind the baffle and out of the air channels. The housing may also include a hood extending over the heat sink where air is exiting the air channels. The hood is positioned to discourage the exiting air from recirculating through the air moving device.

A further aspect of the present invention includes the method for making a folded fin heat sink. A thermally conductive sheet is provided with holes periodically spaced. The sheet is folded to form alternating ridges on top and grooves on the bottom where the holes create openings through the tops of a plurality of the ridges. The holes may be advantageously sized and shaped to form a depressed region beneath the air moving device in any shape such as a rectangle, a bowl or a V-shaped groove. The depressed region beneath the fan has been found to improve the effectiveness of the circulation of air through the heat sink. Indexing is performed prior to folding the sheet to appropriately align the holes in the sheet with the ridge portions being formed.

Other objects and advantages of the invention will become apparent during the following description of the presently preferred embodiments of the invention taken in conjunction with the drawings.

DETAILED DESCRIPTION OF THE PREFERRED EMBODIMENTS

Figure 1:
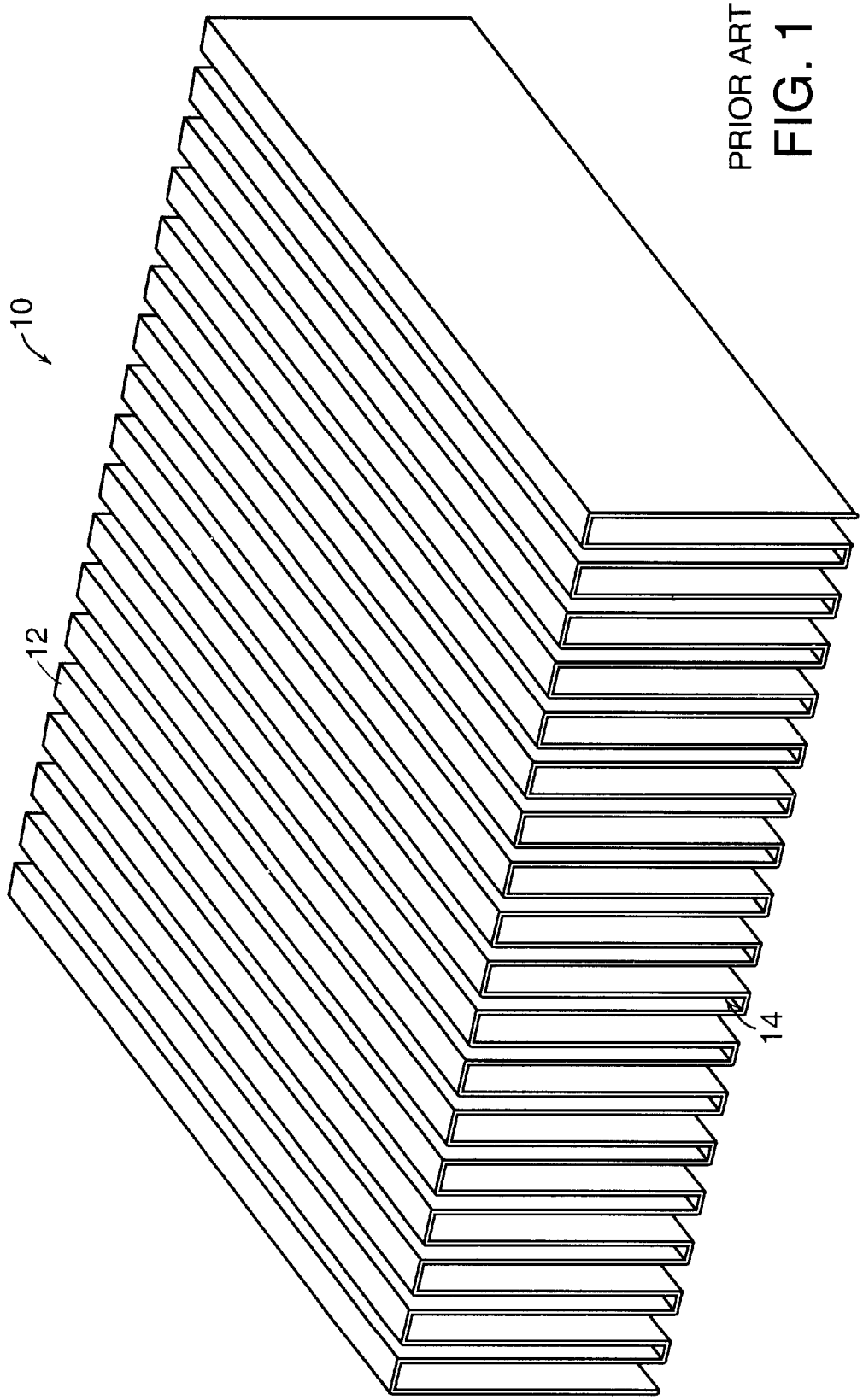
FIG. 1 is an isometric view of a folded fin.

Folded fins, such as that shown in FIG. 1, have been used to form heat sinks in the prior art. Typically, in the prior art, the folded fin is bonded by a method such as brazing to a flat thermally conductive surface. A folded fin is a corrugated sheet of thermally conductive material such as aluminum. Conventional machines are available for taking a flat sheet of aluminum and making the folds required to convert it into a corrugated folded: fin having alternating ridges 12 and grooves (also referred to herein as troughs) 14. The present invention seeks to improve upon the thermal efficiency and costs involved with using folded fin in a heat sink.

Figure 2:
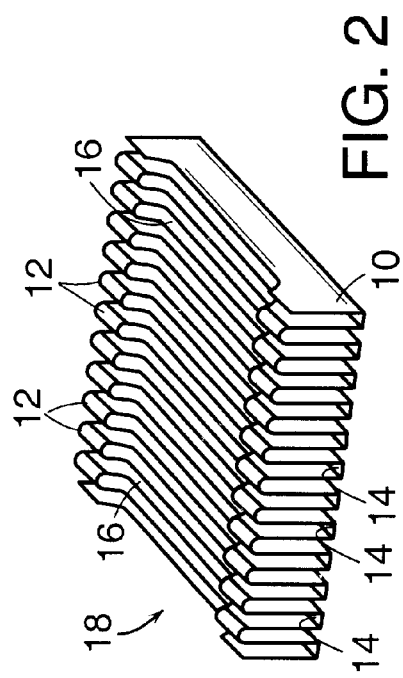
FIG. 2 is an isometric view of an embodiment of a thermally conductive sheet formed in accordance with an embodiment of the present invention.

In accordance with a first embodiment of the invention, openings 16 are formed in the top surfaces of the ridges 12 in a folded fin 10 as shown in FIG. 2. While the solid bottom surfaces of the grooves in the folded sheet provide a surface area for conducting heat away from the surface being cooled, the openings 16 in the ridges permit vertical air flow to draw heat along both sides of all of the walls adjacent the open ridges. Air was always permitted to flow up or down through the groove regions, the openings 16 permit vertical flow of air into the columns between the grooves.

When the folded fin is used with an air moving device such as a fan perched atop the folded fin, air circulation has been found to be improved by providing a depressed region 18 beneath the fan. The depressed region 18 is formed by walls that are shorter than the full height of the ridges 12. In accordance with one preferred embodiment, the depressed region 18 is in the form of a flat rectangular channel as shown in FIG. 2. According to an alternate embodiment, a bowl-shaped region may be formed. The bowl-shaped region leaves an empty bowl-shaped chamber beneath a fan positioned atop the folded fin.

Figure 3:
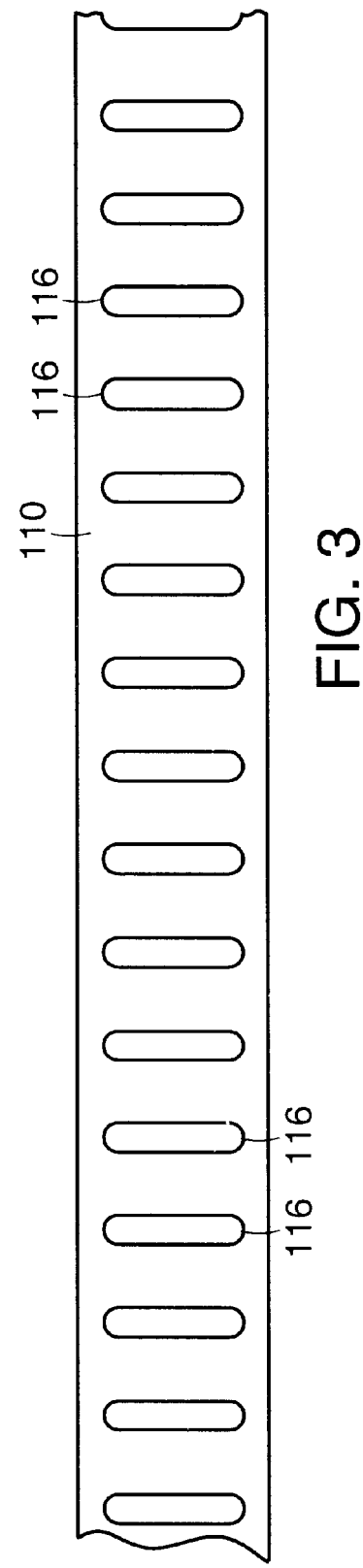
FIG. 3 is a plan view of a thermally conductive sheet prior to folding for making the embodiment of FIG. 2.

Referring now to FIG. 3, the manufacture of a folded fin with a depressed region 18 and openings 16 in the ridges may be simplified by forming perforations prior to folding a thermally conductive sheet 110. A preferred manufacturing method of the invention involves first providing a thermally conductive sheet 110. A preferred sheet metal is aluminum sheet of 0.012" in thickness. In order to form a folded fin with openings 16, this sheet is perforated with slots 116 periodically spaced therein. These slots 116 may be expanded to cut into the walls that will be formed so as to create the depressed region 18. The slots 116 are not expanded into the bottoms of the groove so that the groove bottoms maintain thermal contact with a flat surface below. To form a bowl-shaped region, semicircular cuts of varying radius are cut adjacent the slots to expand the openings through the thermally conductive sheet.

The perforated conductive sheets 110 are provided for use in the folding process.

Indexing of the thermally conductive sheet with the periodically spaced openings is accurately performed so that the slots 116 are aligned with the tops of the ridges 12 during the folding process. Indexing is a difficult process in this maneuver because any degree to which any one cut out is too close or too far from the previous cutout in the strip is compounded. For instance, a commonly accepted tolerance in sheet metal work is 0.005". The slots in the presently preferred embodiment are 0.3 inches wide, the full height of a fin sidewall is 0.45 inches and each ridge and each groove is 0.076 inches wide. The number of fin sidewalls per inch in a presently preferred embodiment is 12. The folded fin of a preferred embodiment is 2" by 2". With these consistently stacked tolerancing issues, only about 38 ridges need to be off by 0.005" for the entire assembly to be non-functional because the slots would be on the fin side walls rather than the ridge tops. 38 ridges is about 3 parts in the present embodiment. Another significant barrier to indexing is speed. High speed folding machines can fold as much as 300 folds per minute. In the present embodiment, the material actually stops transit for a very short time. In this stopped transit, the cutting machine must punch the hole, and the die must exit the hole before the folding machine pulls the metal forward. Further compounding this problem is that thin conductive metal such as aluminum is susceptible to stretching. The solution is to have the punching machine designed into the folding machine, so the punching takes place as close to the point of folding as possible. In the present embodiment punching takes place merely 6" upstream from the folding machine. In a presently preferred embodiment the slots are cut 6" upstream from the point which the machine folds the sheet converting the flat sheet into a corrugated sheet with alternating grooves and ridges.

Figure 4:
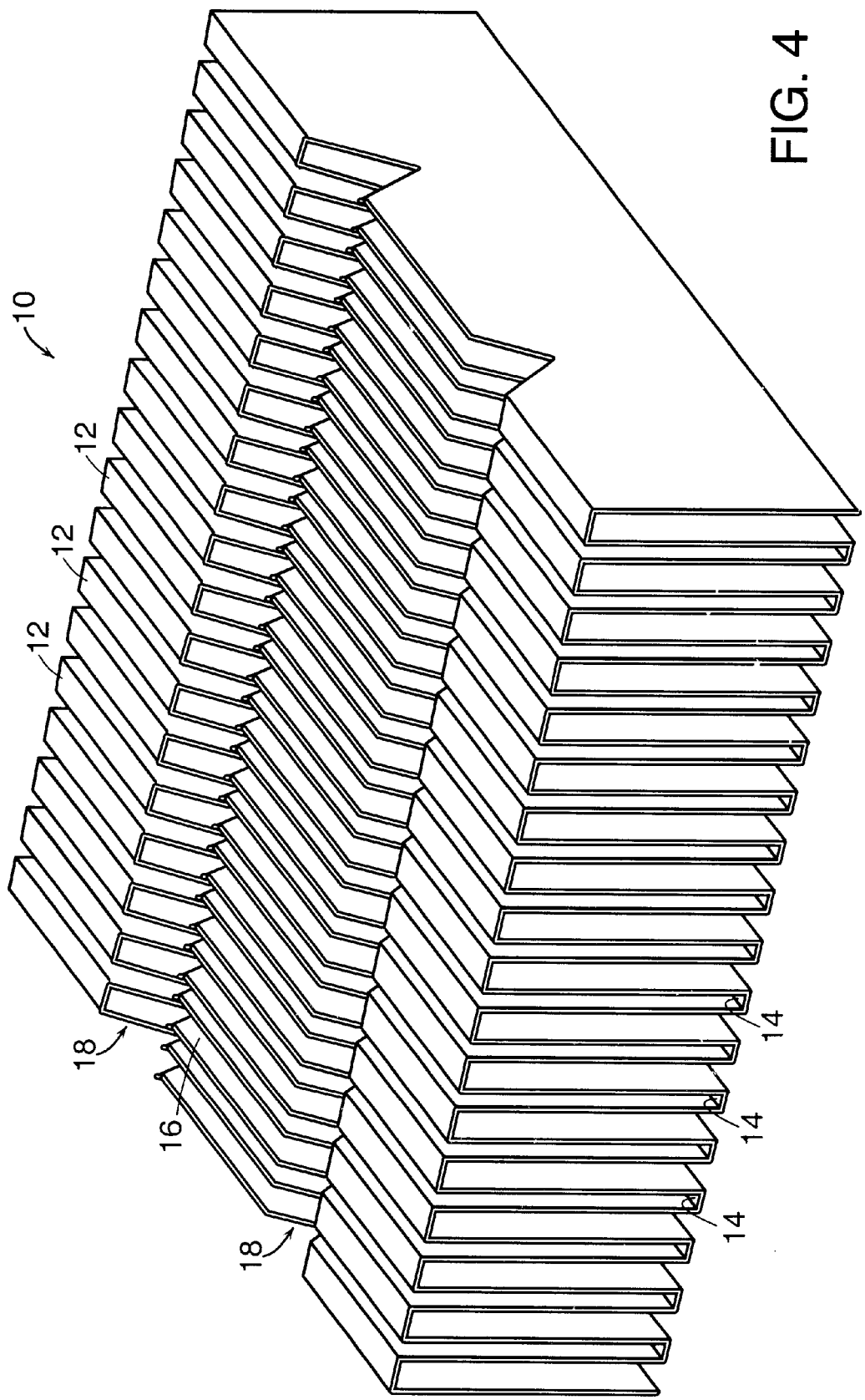
FIG. 4 is an isometric view of an alternate embodiment of a thermally conductive folded sheet.
Figure 5:
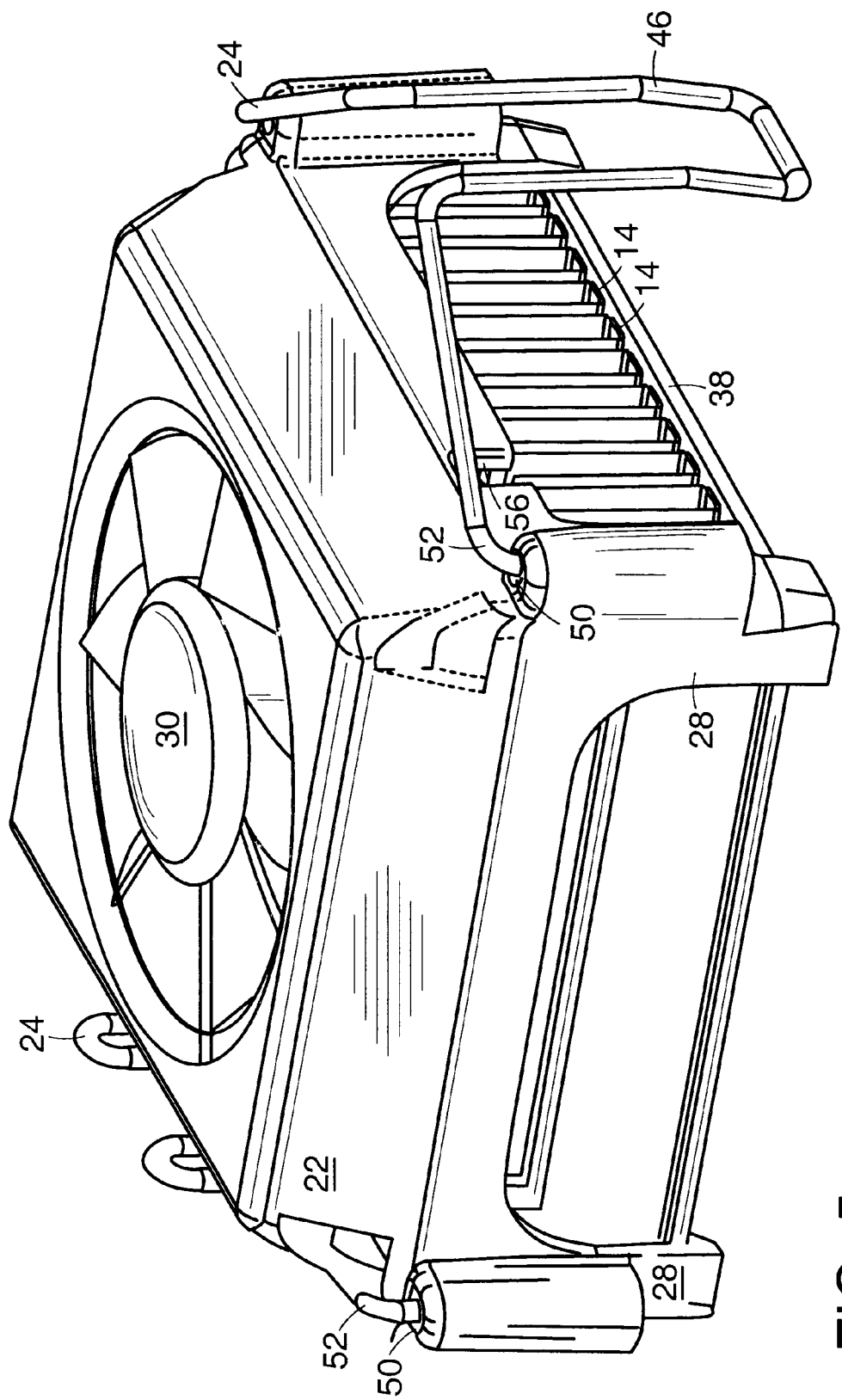
FIG. 5 is an isometric view of an embodiment of an active heat sink of the present invention.
Figure 6:
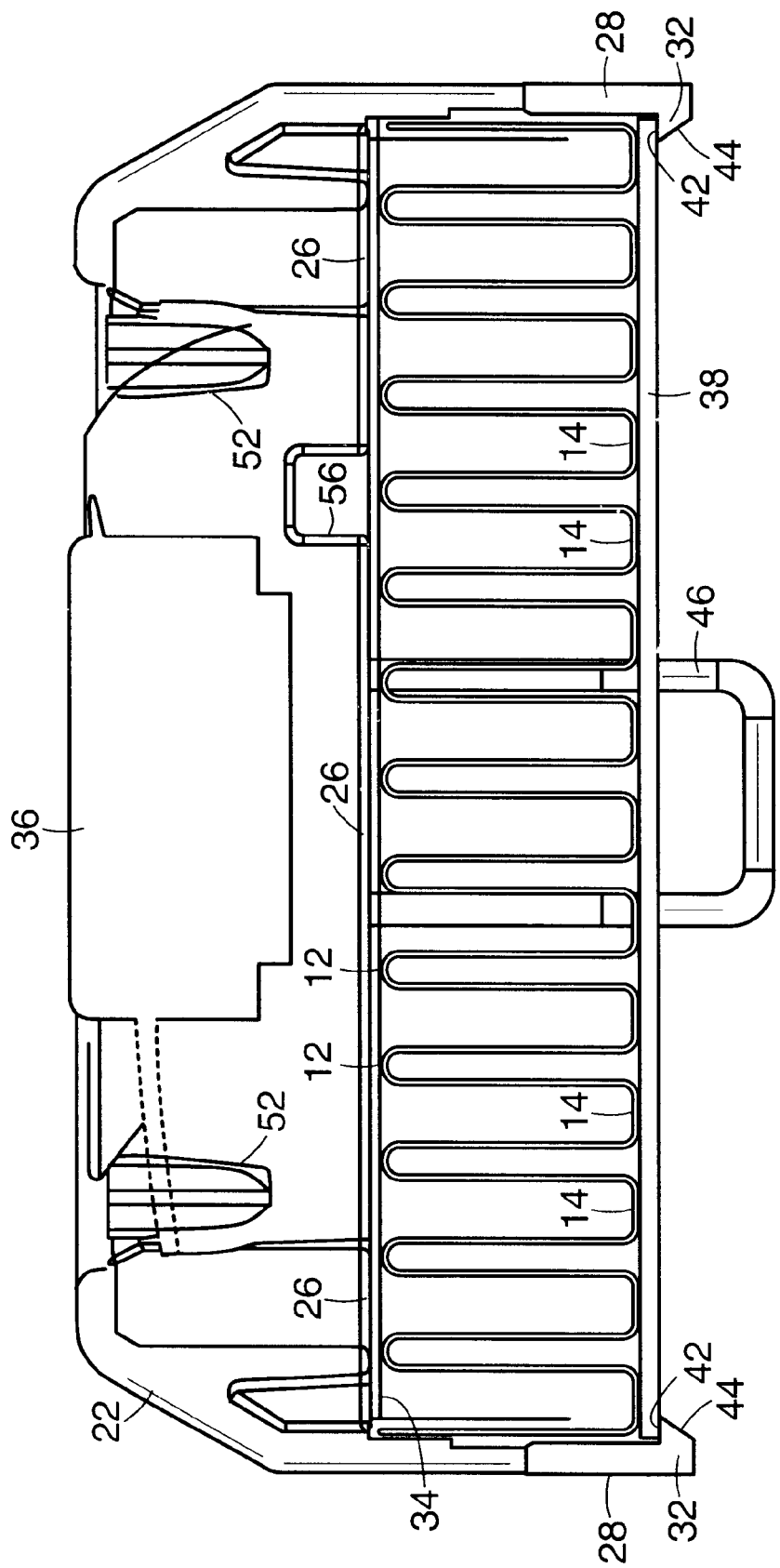
FIG. 6 is a cross-sectional view of the active heat sink of FIG. 5 with the fan removed for simplifying the view.
Figure 7:
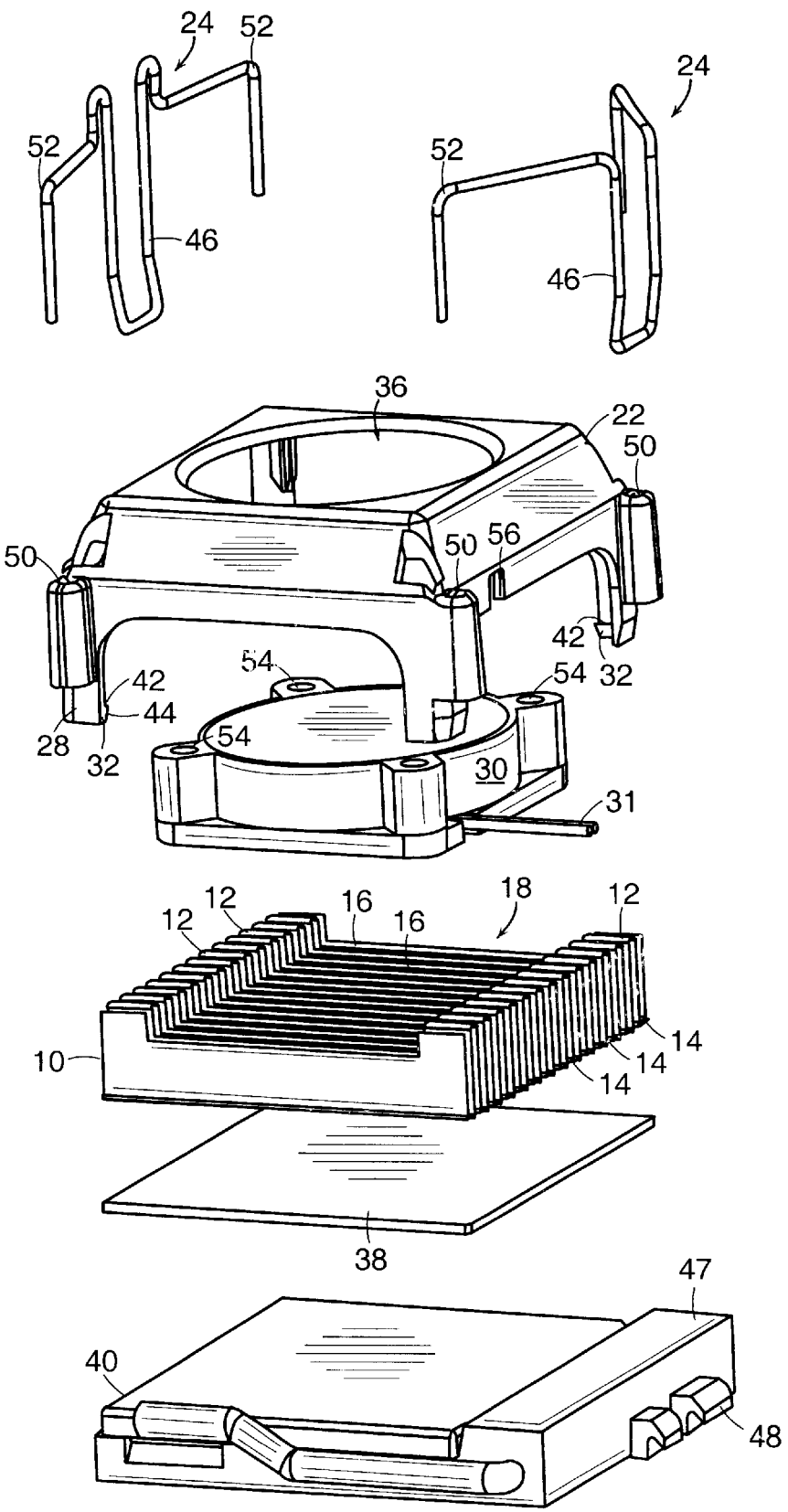
FIG. 7 is an exploded view of the heat sink of FIG. 5.
Figure 8:
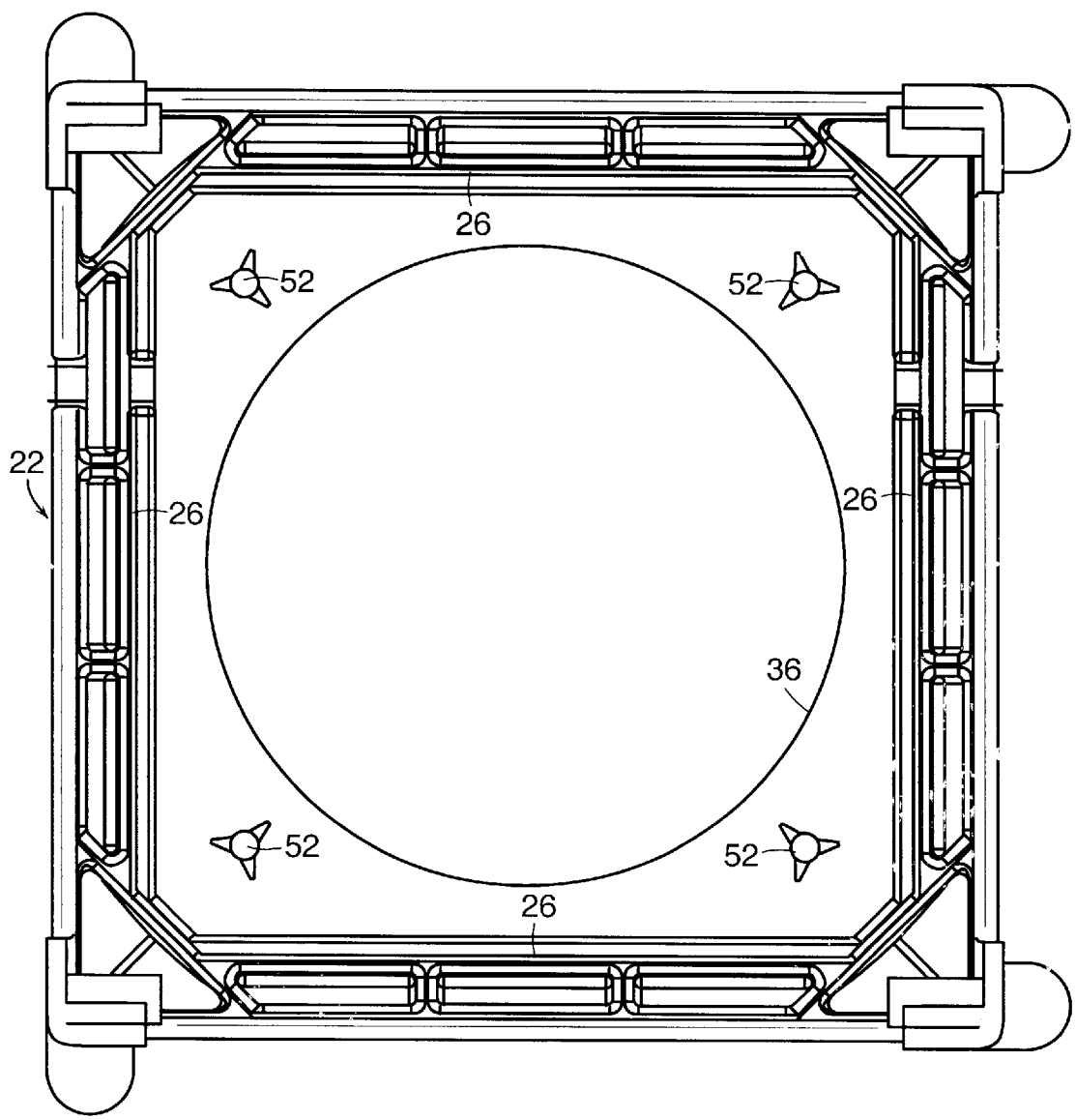
FIG. 8 is a bottom view of the cap 22 of FIG. 7.
Figure 9:
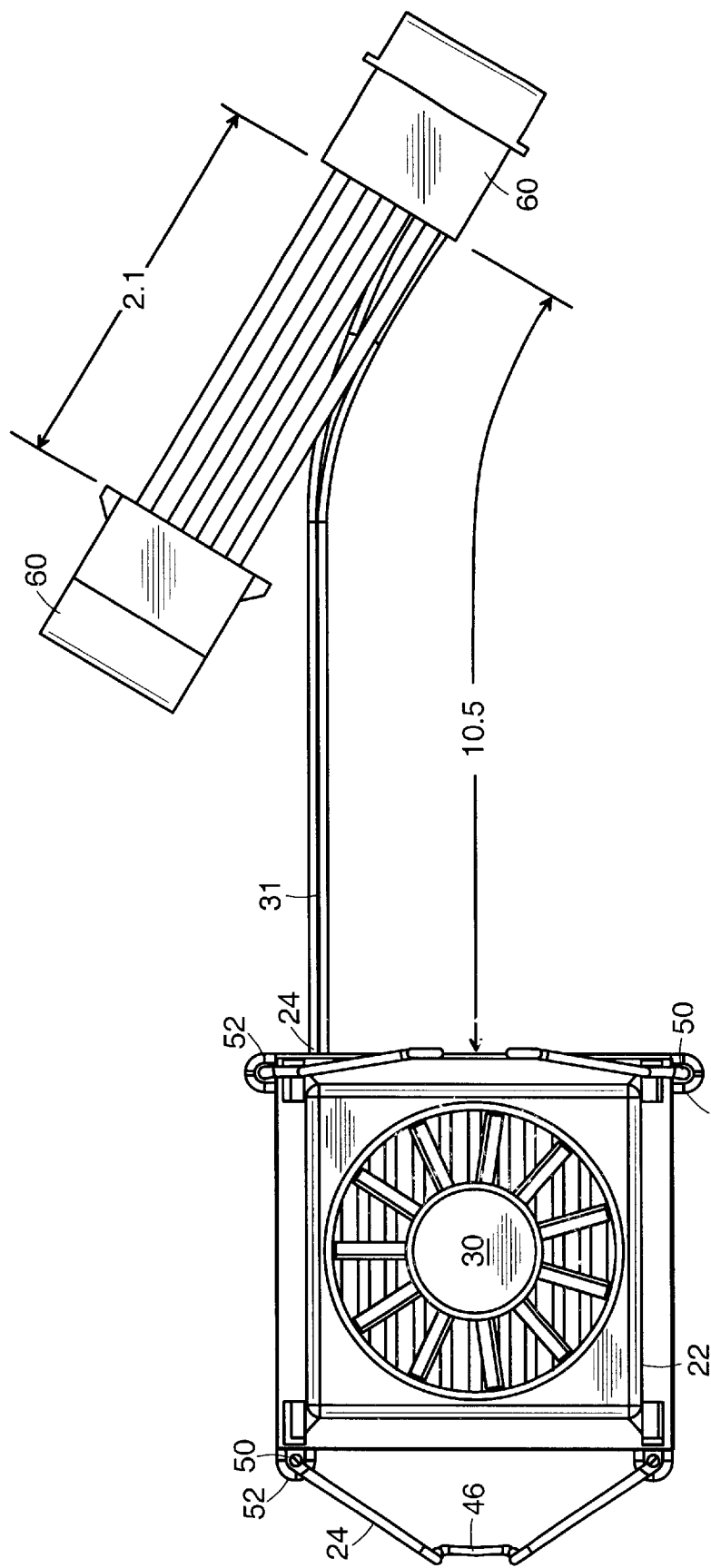
FIG. 9 is a plan view of the heat sink of FIG. 5.

Referring now to FIG. 4, an alternate embodiment of a folded fin thermally conductive sheet for use with the present invention is shown. Openings 16 have been formed in the ridges 12 of the folded fin. In addition, a pair of depressed regions 18 have been formed through the top of the folded fin. The depressed regions 18 of FIG. 4 are V-shaped grooves. The V-shaped grooves may be formed by providing essentially diamond-shaped cutouts in the thermally conductive sheet prior to the folding step. The use of the depressed regions 18 have been found to improve air circulation through the folded fin as compared with the embodiment in which all the walls extend up to the top of the folded fin.

In order for a folded thermally conductive sheet to function as a heat sink, thermal contact is required between the folded sheet and a surface to be cooled. Referring now to FIGS. 5–9, clamping is used in accordance with an aspect of the invention to force the grooves of the thermally conductive sheet against a thermally conductive bottom plate 38. In accordance with a presently preferred embodiment, the bottom plate 38 is made of aluminum 32 thousandths of an inch in thickness. The bottom plate 38 is placed in direct contact on a substrate 40 to be cooled such as an integrated circuit chip. A clamped folded fin of the invention may also be used without the bottom plate so that the folded fin clamps directly on the substrate to be cooled. The use of an effective clamp mechanism which maintains pressure between the folded fins and the flat plate or substrate is less costly than employing a brazing method which fixes the folded fin to the plate.

The cap 22 may include the clamping mechanism. The cap 22 includes a top abutment member 26 or surface that extends across the tops of substantially all of the ridges in the thermally conductive corrugated sheet to press down against substantially all of the ridges. Any unevenness among the various ridges and grooves may cause pressure to be applied through some of the grooves but not others. Such a situation may be minimized by employing a compressible gasket 34 on top of the ridges to spread the pressure over substantially all of the ridges so that good surface contact is achieved between the grooves and the substrate beneath it. Such a gasket 34 may be made from a polyethylene foam.

The bottom abutment portion of the clamping mechanism may be formed on appendages 28 extending down from the top of the cap 22. In the presently preferred embodiment, the cap appendages 28 extend down from the four corners of the cap. Each of the four corner appendages is provided with a flange or tab 32 that extends inward. Each flange 32 has an edge 42 for hooking beneath the bottom plate 38. The relaxed distance between the top abutment member 26 and the flanges 32 is small enough to provide a tight fit for the ridges 12 of the thermally conductive folded sheet and the bottom plate 38 to be held therebetween. The underside of the flanges 32 are preferably ramped so that during assembly, the bottom plate 38 can be easily snapped into the cap beneath the folded sheet. The plate is pressed up against the ramps 44 forcing the appendages outwards until the plate clears the top edge of each flange. At this point the appendages 28 snap onto the plate. The appendages 28 thus act as latch members. By sandwiching the folded sheet and the bottom plate between the top abutment and the flanges 126, pressure is applied to improve the thermal contact between the folded sheet and the bottom plate. The presently preferred cap 22 is made from a plastic such as flame retardant PCABS. Moreover, the presently preferred cap is an integral molded plastic component that includes the top abutment 26 and the appendages 28. The cap is sufficiently resilient to permit the appendages to bend outwards to accommodate the bottom plate 38 and to reach the flange 32 beneath the bottom plate.

The typical CPU chip is clamped into a base in a conventional manner. Typically, a ZIF socket 47 is used. The active heat sink is placed over the CPU chip. Spring clips 24 on the housing each include a loop 46 that locks beneath a hooking surface 48 on the CPU base. The spring clips 24 are flexible so that they may be pulled into engagement with the hooking surfaces 26 of the CPU base. Once locked, the springs 24 act to pull down on the cap 22. The springs 24 thus act as an additional clamp providing continuous pressure downward against the cap which is transmitted in turn to the corrugated thermally conductive sheet and the bottom plate 38. In particular, the bottom plate 38 is held in tight thermal contact with the substrate 40 to be cooled, in this case the CPU chip. According to the presently preferred embodiment, the spring clips 24 have opposite ends each of which is vertically supported within a cylindrical well 50 in the cap 22. The cap 22 is provided with four vertical cylindrical wells 50 to secure the spring clips 24. The clips 24 include a bend 52 for holding the clip on the well 50 and transmitting downward force to the cap 22. The loop 46 extends down to engage the hook 48 on the CPU socket 47.

In accordance with a further aspect of the present invention, a fan 30 may be housed in the cap 22 above the corrugated thermally conductive sheet 10. The cap 22 includes an opening 36 through which the fan 30 can move air. The cap 22 may be provided with tapered posts 52 for snugly fitting into aligned holes 54 in a fan assembly to attach the fan 30 to the cap 22. The fan 30 is designed to force air between the fins or walls of the thermally conductive sheet. Thus, this is called an active heat sink. The heat sink includes the thermally conductive folded sheet 10. While a simple folded fin of the prior art as shown in FIG. 1 may be used, improved thermal efficiency is achieved by providing openings 16 and further providing a depressed region 18.

Power may be provided to the fan 30 by a battery or through conductive wires 31 connected to the fan that may be attached to a power source within the computer system. A recess 56 in the cap wall may be included to accommodate the wires 31. The wires may lead out to plug connectors 60 for interconnection with the power supply of the computer system. The fan 30 may be used to move air either down through the thermally conductive folded sheet or may be used to pull air in the opposite direction up through the folded sheet. The effectiveness of the vertical flow of air is substantially enhanced by providing openings 16 in the tops of the ridges of the folded sheet 10. In accordance with a presently preferred embodiment of the invention, the folded sheet with openings 16 and a depressed region 18 is able to provide a cooling surface area of 66 square inches on a CPU that occupies 4 square inches in area wherein the ridges are only ½" high.

A gasket 34 may be added, if needed, on top of the folded fin for spreading the pressure of the clamp over all of the ridges 12. The gasket 34 is inserted between the top of the folded sheet and the top abutment within the cap. The combined height of the gasket 34 and the ridges 12 of the thermally conductive folded sheet exceed the clearance between the bottom plate 38 and the abutment members. Thus, once the plate has been snapped into the cap, pressure continues to be applied downward through the gasket against the tops of the ridges of the folded sheet. In addition to being open at the top for the vertical flow of air, the cap is also provided with openings on the sides adjacent the ends of the grooves and ridges. The side openings permit a horizontal flow of air into or out from the conductive folded sheet.

Embodiments of the invention may be made in which the corrugated sheet may be pressed directly against a CPU by snapping the cap 22 onto the CPU or the socket containing the CPU. There the appendages need to be designed of dimensions that adequately fit for squeezing the corrugated sheet to the CPU. Alternatively, the thermally conductive bottom plate 38 may be squeezed between the CPU and the thermally conductive folded sheet.

Figure 10:
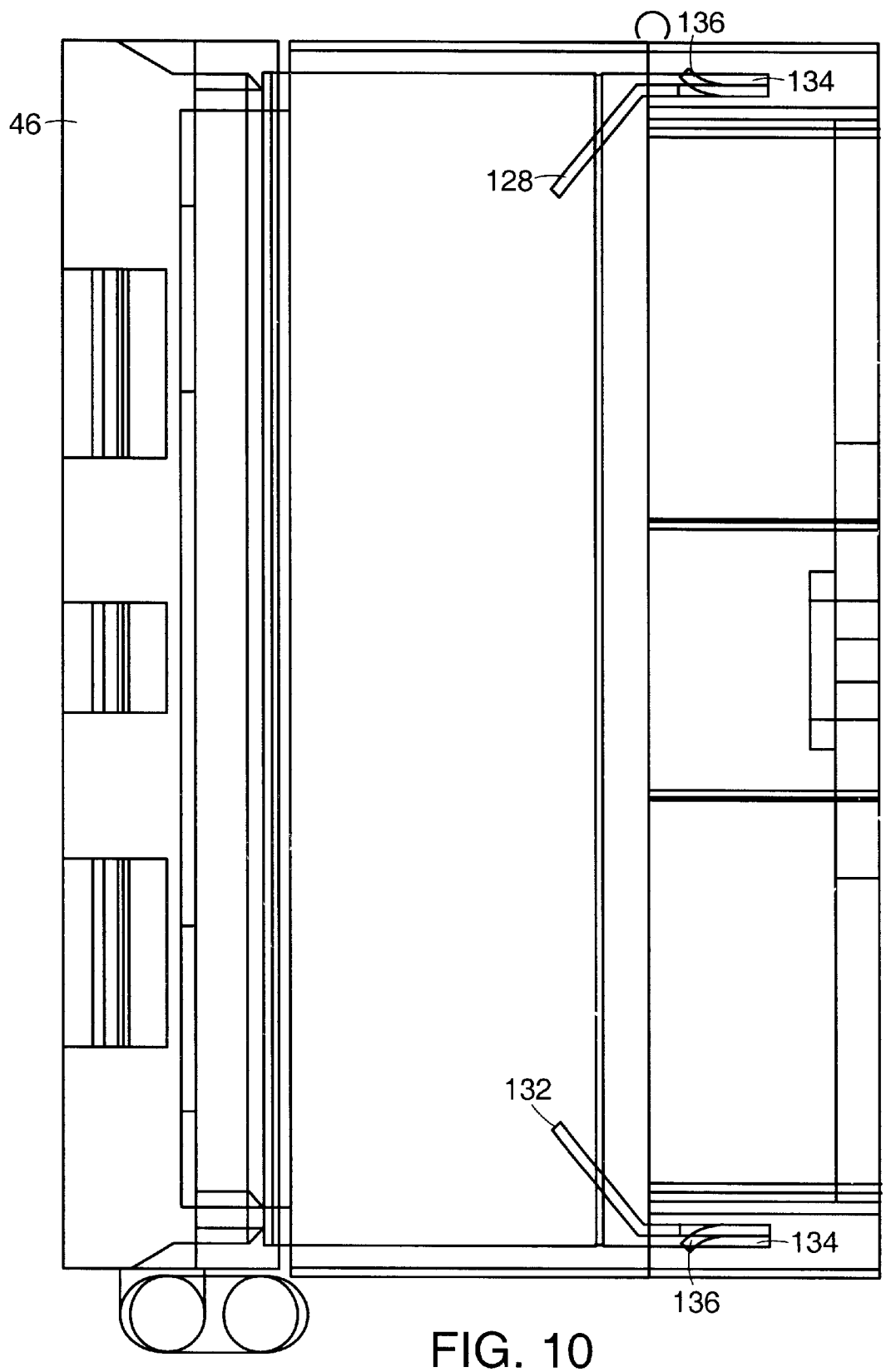
FIG. 10 is a side cross-sectional view of an alternate embodiment of a heat sink of the present invention.
Figure 11:
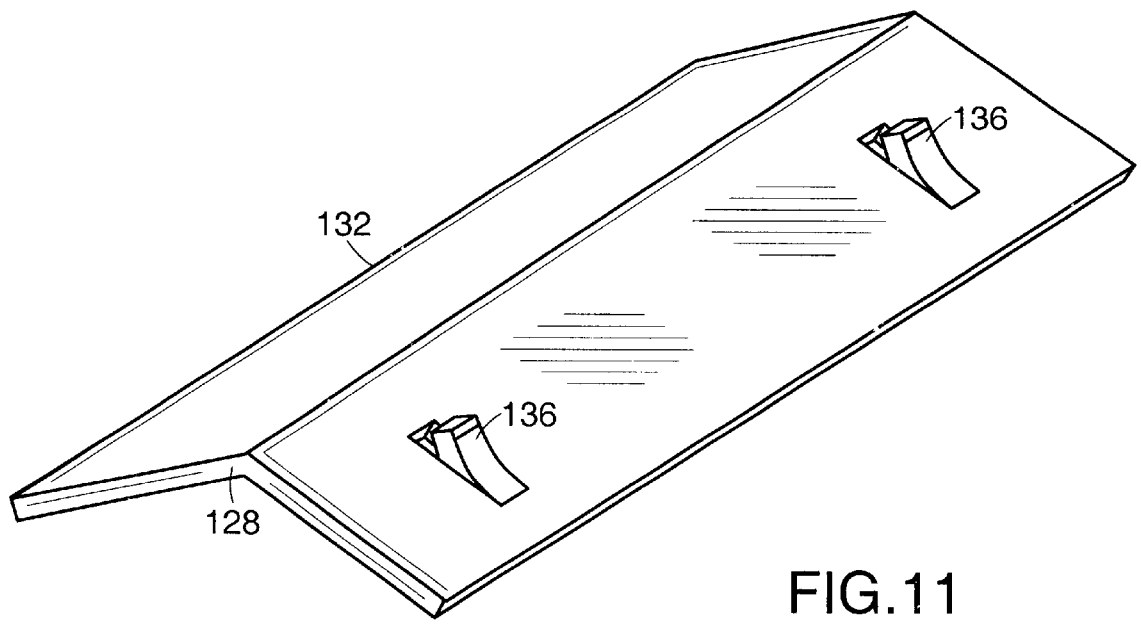
FIG. 11 is an isometric view of an elongated spring used in the heat sink of FIG. 10.

In order to provide additional resilience to the cap 22, according to an alternative embodiment the abutment members may be springs 128 for contacting and pushing down against the tops of the ridges 12 of the folded sheet as shown in FIGS. 10 and 11. The spring 128 would push against the ridges or the gasket. The spring 128 may be an elongated edge 132 that extends across the tops of substantially all of the ridges 12 on the folded sheet 10. A metal sheet spring is suitable. In one embodiment, there are two springs that are inserted into wells 134 in the underside of the top of the plastic molded cap. Each spring includes two anchor extensions 136 that are punched from the spring steel plate. These punched out pieces act to anchor the spring steel in the well 134 of the housing. The spring is a bent plate. The thickness and bend in the plate are designed so that an appropriate pressure is applied to the tops of the ridges of the folded sheet to obtain the desired contact at the bottom of the folded sheet between the bottom surfaces of the grooves 14 and the plate or substrate in contact therewith.

Figure 12:
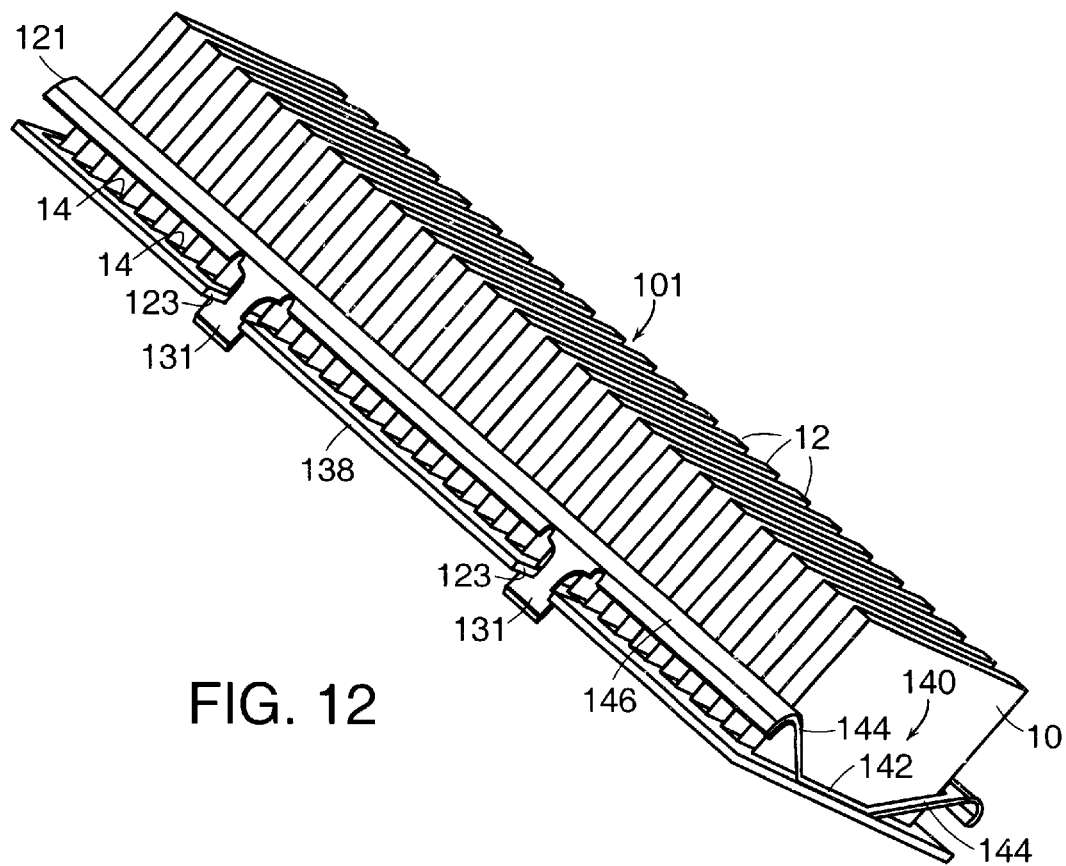
FIG. 12 is an isometric view of a heat sink assembly of an alternate embodiment of the invention.

Referring now to FIG. 12, an alternate heat sink assembly 101 of an embodiment of the present invention is shown. Instead of clamping against the ridges of the folded fin, this embodiment provides for clamping against the grooves or troughs. The heat sink assembly 101 is made using a convoluted fin or folded fin 10. The folded fin 10 is a thermally conductive sheet that has been folded into a series of alternating ridges 12 and troughs 14. The folded fin 10 advantageously provides a significant amount of surface area from which air can dissipate heat. A presently preferred folded fin is made from an aluminum sheet 0.254 mm. thick. The height of the fins forming the ridges 12 and troughs 14 depends on the desired application. The taller the fins the more surface area and thus the greater amount of heat dissipation achieved for a given amount of air flow. Holes of various sizes may be cut in the ridges of the folded fin as described above to provide additional pathways for air movement through the heat sink.

The folded fin 10 is placed on a thermally conductive base plate 138. In order to improve thermal conductivity in accordance with a presently preferred embodiment, a thermally conductive grease is spread over the base plate 138 for improving the thermal contact with the troughs 14 of the folded fin 10. The base plate 138 is a flat, stiff piece of aluminum sheet in accordance with a presently preferred embodiment. The length of the base plate 138 closely approximates the length of the folded fin to be placed thereon. The width of the base plate extends beyond the folded fin on both sides to accommodate a spring clamp 121 which is used to attach the folded fin 10 to the base plate 138. A pair of notches 123 are formed along one edge of the base plate 138. Along the opposite edge, a pair of substantially longer notches 125 are formed along the edge of the base plate. The spring clamp 121 has feet or tabs 131 for engaging with the notches beneath the edge of the base plate.

The spring clamp 121 includes a series of flexible linkages 140 for pressing a trough 14 against the base plate 138. Each flexible linkage included in the presently preferred embodiment includes an abutment portion for making contact with the trough 14 of the folded fin 10. In the present embodiment, the abutment portion is a flat mid-portion 142. The preferred embodiment includes a flexible linkage for each of the troughs in the folded fin. Less demanding heat sink applications may make do with fewer flexible linkages. At opposite ends of each flat mid-portion 142, each flexible linkage includes an angled leg portion 144. The angled leg portions extend up from the flat mid-portion to attach to a cross-bar 146. There are two parallel cross-bars, each on an opposite side of the spring clamp 121 Each cross-bar 146 is connected to all of the flexible linkages. When the spring clamp 121 is connected by its tabs 131 to the base plate 138, the spring clamp applies pressure through the flat mid-portions 142 to the troughs 14 of the folded fin to provide excellent thermal contact with the underlying base plate 138.

Figure 13:
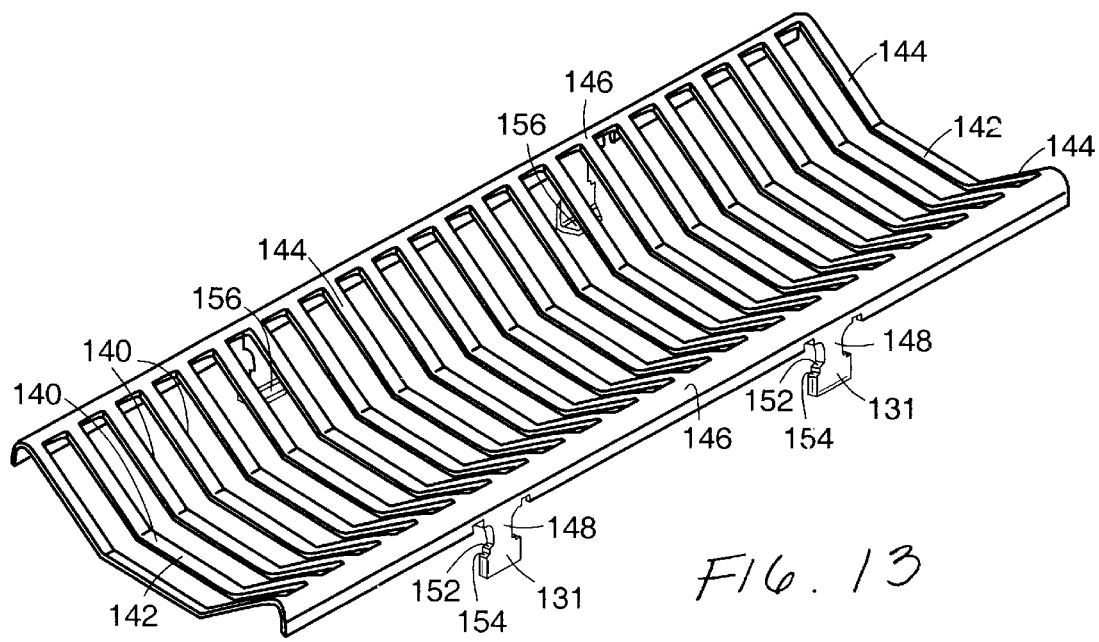
FIG. 13 is an isometric view of a spring for use in the heat sink assembly of FIG. 12.

Referring now to FIG. 13, the spring clamp 121 is shown in greater detail. The tabs 131 depend from the spring clamp 121 In particular, the tabs 131 depend down from the cross-bar 146. There are four tabs in the presently preferred embodiment of the spring clamp 121. A "tab" is defined as any clamping mechanism formed by a projection or member that may be used to engage beneath an edge of a plate. The invention may also be formed by substituting a clamping mechanism capable of engaging the base plate in ways other than latching beneath an edge such as latching onto other clamp receiving members and corresponding openings added to a base plate. A stem 148 connects the tab 131 to the cross-bar 146. The stem 148 is narrow so that it may move within a correspondingly narrow slot or notch in the base plate or substrate to be cooled. The tab 131 of the embodiment in FIG. 13 is stepped. A first step 152 juts out from the stem 148. The first step 152 extends out from opposite sides of the stem 148. The first steps 152 are wider than the narrow slots. Thus, the first steps 152 butt against an edge of the base plate adjacent a narrow slot. A second step 154 extending beneath each of the first steps permits engagement beneath an edge of the base plate in an area of a wider slot or notch region. A wider slot or notch region is dimensioned so as to permit the first steps 52 to fit therein but to be too narrow to permit the second steps 154 to fit therein. The tabs 131 are further provided with a bent portion 156 at the end of the tab furthest from the cross-bar 146. The bent portion 156 bends inward such that the four bent portions 156 may be used to clamp onto a substrate to be cooled. While bent portions are shown in the present embodiment, any projections capable of grabbing onto a substrate may be substituted for the bent portions. The spring clamp 121 of the presently preferred embodiment is advantageously entirely formed from a single piece of resilient stainless steel sheet.

Figure 14:
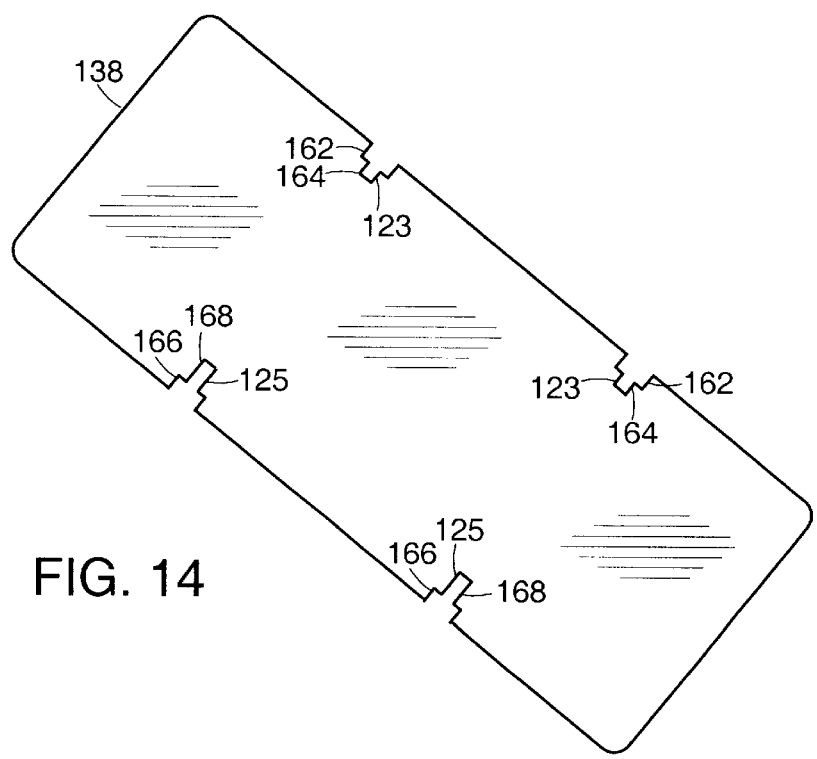
FIG. 14 is a plan view of a base plate for use in the heat sink assembly of FIG. 12.

Referring now to FIG. 14, a preferred base plate 138 is illustrated. The base plate 138 has clamp receiving openings that are located for accepting a clamp mechanism such as the tabs from the spring clamp 121. The clamp receiving openings are the notch regions discussed above in the present embodiment. Each of the notches includes a wide slot and a narrow slot. The wide slots fit a stem 148 or a first step 152 but not a second step 154. The narrow slots are only wide enough for the stems 148 to fit therein. Along one edge of the base plate 138, the short notches 123 each include a wide slot portion 162 which leads to a narrow slot portion 164. Along the opposite edge of the base plate, the long slots 125 each include a wide slot region 166 and a narrow slot 168. The narrow slot 168 is substantially longer than the narrow slot 164 found on the opposite side of the base is plate. In assembling the heat sink assembly, the long narrow slot 168 accommodates the stems 148 on one side of the spring 121 to be inserted therein and slid along those long slots 168. Thus, the tabs 131 on the opposite side of the spring 121 can be lowered beneath the base plate beyond the edge of the base plate. The tabs 131 are brought into position against the slots 123 and the cross-bars 146 are pushed on to force the tabs 131 toward the base plate until the wide second steps 154 engage the edge of the base plate beneath the wide slot 162. On the opposite side of the base plate 138, the tabs 131 are to be pushed outwards moving their stems 148 through the narrow slot 168 until the first steps 152 fall into the wide slot 166 and the second steps 154 engage beneath the base plate 138. Thus, all four tabs will be in engagement beneath the base plate holding the folded fin against the base plate. All the tabs will have their second step 154 engaged beneath an edge of the base plate and their first step 152 will butt against the base plate edge adjacent the narrow slot. Opposing tabs are, thus, forced apart from the relaxed position of the spring clamp 121. This provides a heat sink assembly that can be shipped. The heat sink assembly is ready for placement against a flat substrate to be cooled.

The heat sink assembly of FIGS. 12–16 is particularly suited for operation with a Pentium II microprocessor chip manufactured by Intel. The Pentium II has a thermal plate on which a heat sink may be attached. The thermal plate has a number of oval slots. With the four tabs 131 engaged in their wide slots, they are positioned so that the heat sink 101 may be placed on the Pentium II thermal plate with the tabs dropping into the slots of the thermal plate. With the heat sink in place on the thermal plate, it is a simple matter to push down on both cross-bars 146 to attach the heat sink to the thermal plate. In the preinstallation condition, all of the tabs 131 are in their wide slots. In the short slots 123, the tabs are held in wide slot 162. In the long slots 125, the tabs are held in the wide slots 166. Thus, for all of the tabs 131, the step between the wide slot and the narrow slot in the base plate prevents the tabs from compressing closer to each other. Thus, during the simple process of pressing the two cross-bars 146 down towards the base plate, the tabs 131 are pushed below the base plate into the thermal plate slots. When the first steps 152 are pushed below the base plate 138, the stems 148 are free to move within the narrow slots towards one another. The tabs are held apart by the bent portions 156 against the edge walls of the slots in the thermal plate. The tabs are pushed down until the bent portions 156 fit beneath the slot edges in the thermal plate. The resilience of the spring then urges the tabs to spring back toward their opposing tab. Thus, the bent portions 156 of the tabs snap onto the thermal plate firmly attaching the heat sink assembly thereto. Thus, the simple movement of the cross-bars down causes the tabs 131 to move down so that the tabs 131 may catch beneath the thermal plate of the Pentium II. Moreover, with the tabs forced down by the bent portions 156 being extended below the thermal plate, the tension on the spring 121 provides significant pressure against the troughs of the folded fin against the base plate 138. The dimensions of the spring clamp 121 and base plate 138 are such that with the tabs attached to a Pentium II thermal plate, in accordance with a presently preferred embodiment, the force may be about 30 lbs. of pressure between the base plate 138 and the thermal plate. The thermal contact between the base plate 138 and the thermal plate can be further enhanced by applying a layer of thermally conductive grease to the underside of the base plate 138. In the presently preferred embodiment, a non-silicone based grease is used, in particular, AOS non-silicone HTC-15. The heat sink assembly as described herein advantageously permits clamping of a folded fin to a base plate and attachment of the heat sink assembly to a substrate to be cooled using the same action of pushing the cross-bars 146 towards the base plate of the heat sink assembly. The spring clamp 121 performs both the function of clamping the folded fin to the base plate and clamping the heat sink assembly to a substrate to be cooled.

Figure 15:
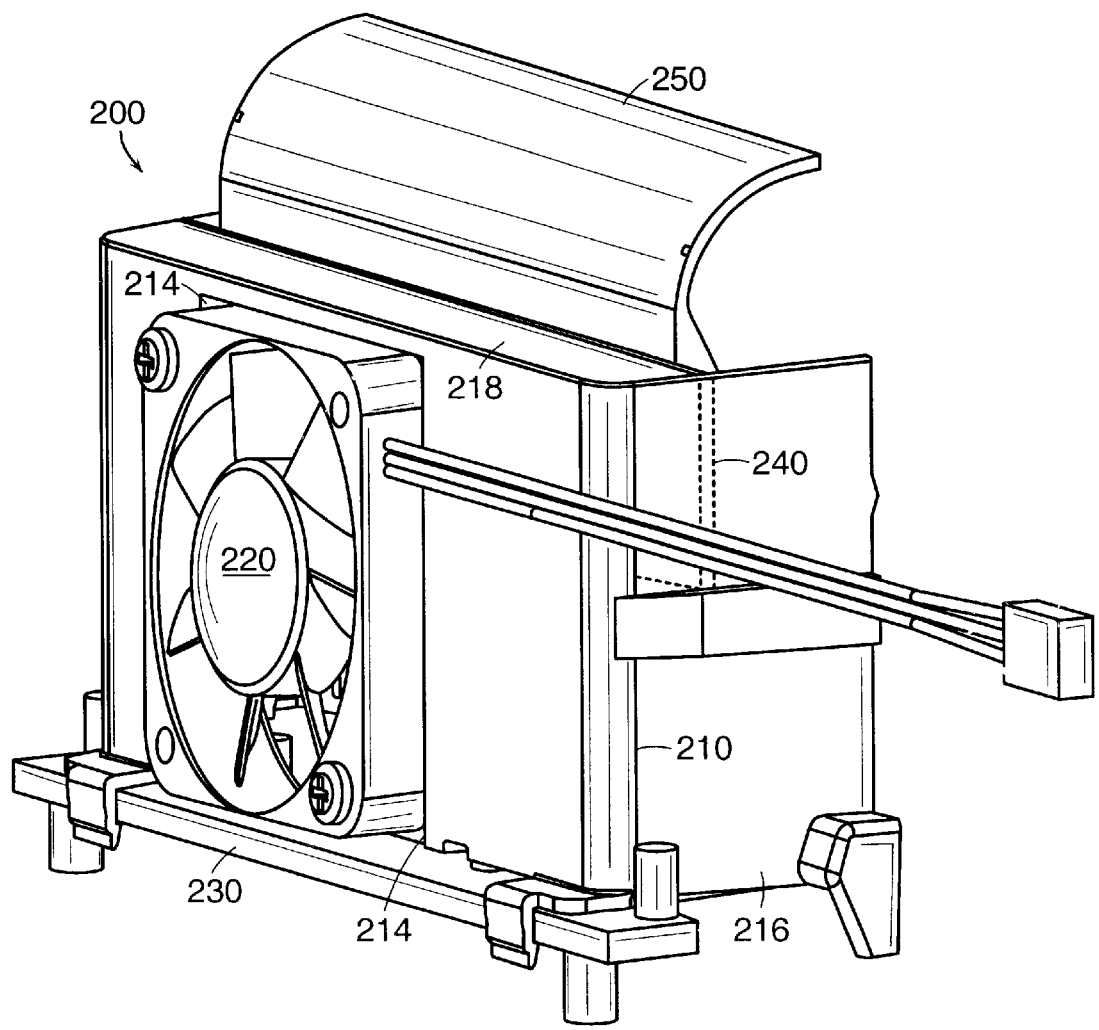
FIG. 15 is an isometric view of a cooling fan assembly of an embodiment of the invention.
Figure 16:
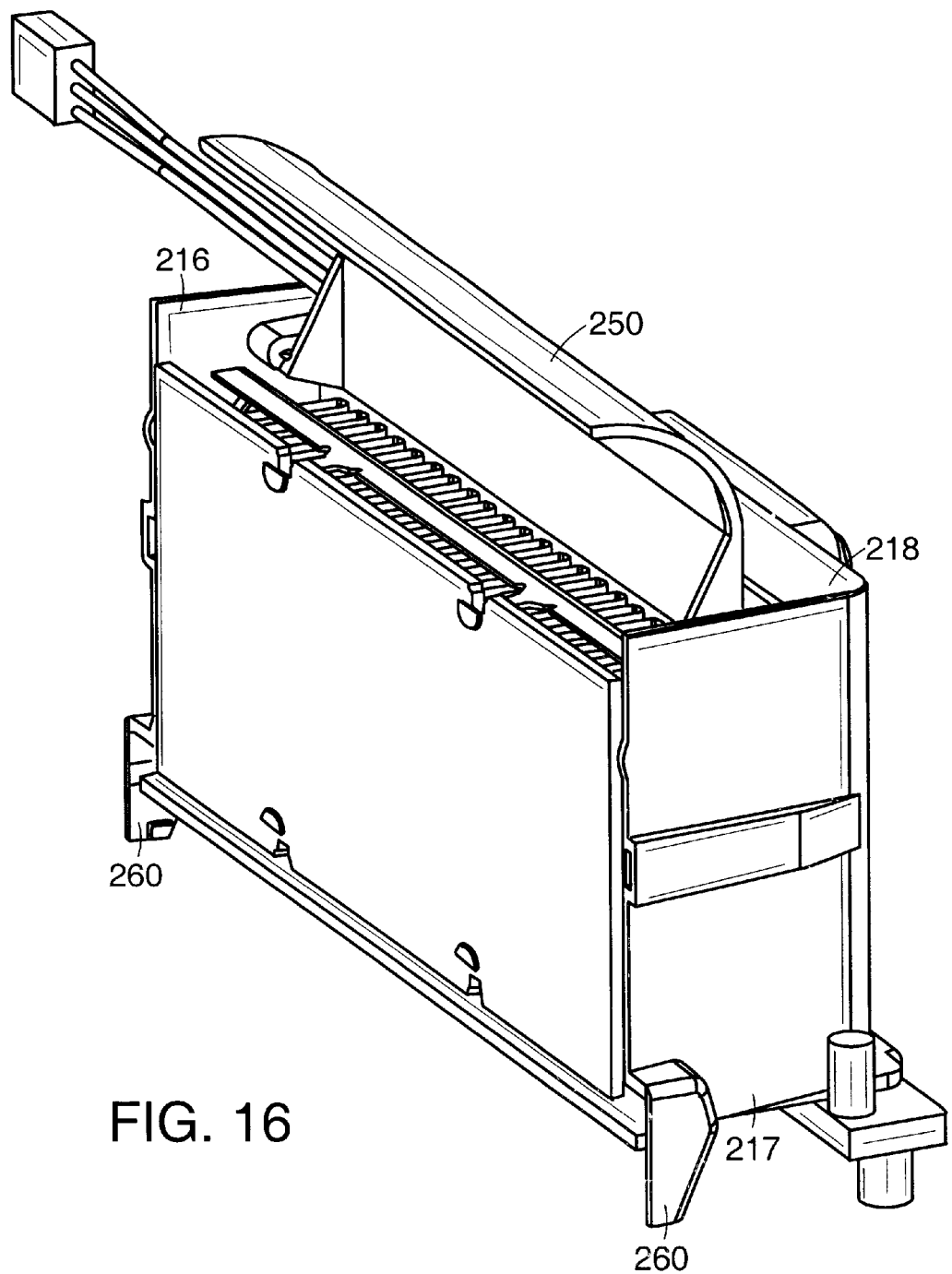
FIG. 16 is an isometric view of the heat sink assembly of FIG. 12 in conjunction with the cooling fan assembly of FIG. 15.

While the heat sink assembly 101 is highly efficient for its size at dissipating heat, nevertheless microprocessors such as the Pentium II generate a tremendous amount of heat such that an air flow will be required through the folded fin to obtain sufficient cooling. The air flow may be provided by a fan in the chassis of the computer or it may be provided by a fan dedicated to the microprocessor. An additional microprocessor fan with shroud assembly of an embodiment of the present invention is illustrated in FIGS. 15 and 16. The cooling fan assembly 200 includes a housing 210. An air moving device, preferably a fan 220, is mounted on top of the housing 210. An opening 214 in the housing accommodates the fan 220. The fan 220 blows into a chamber formed by the housing 210. The fan 220 directs air perpendicular to the base plate 138. The chamber is bordered by a right sidewall 216, a left sidewall 217 and a front sidewall 218. The cooling assembly 200 mounts on a plastic heat sink support 230 on the motherboard to complete the air chamber.

In accordance with an embodiment of the invention, a baffle 240 extends from the front sidewall into the chamber obstructing air flow from the fan 220. The baffle extends from the left sidewall to the right sidewall. In the preferred embodiment, the baffle 240 extends about half way across the chamber. Thus, a portion of the air blown from the fan 220 is directly blocked by the baffle 240. The baffled housing thus directs air from the fan around the baffle and into the channels formed by the folded fin. By using the baffle 240 to redirect the air into the channels, improved cooling efficiency is achieved. The baffle 240 is particularly useful with a solid folded fin lacking the openings 16 described above in connection with other embodiments. The baffle 240 also protects the air moving in the channels behind the baffle from turbulence or interference by air blown from the fan. Thus, air movement through the channels is improved The cooling fan assembly 200 may be likewise useful with other heat sinks formed with a plurality of parallel channels. Such channels may be formed as in the prior art from an extruded metal heat sink.

Air moved through the channels of the heat sinks will exit behind the baffle 240 near the front sidewall 218. It is additionally useful to provide a hood 250 extending out from the front sidewall and projecting beyond the baffle 240 so as to deflect air exiting from the heat sink. The object of the hood 250 is to discourage air from recirculating back through the fan 220 into the heat sink. If desired, the hood 250 may be pivotally attached to the housing 210 so that its angle deflection may be adjustable. The housing 210 is provided with feet 260 that snap into place against a processor retention mechanism. The housing 210 may be made from a plastic material. The presently preferred fan is a 3300 RPM Hypro bearing fan.

Of course, it should be understood that various changes and modifications to the preferred embodiments described above will be apparent to those skilled in the art. For example, the substantially parallel walls of the thermally conductive sheet may be formed by other commonly known manufacturing processes. Also, a variety of common clamping mechanisms may be used to maintain pressure downward against the ridges or troughs of the thermally conductive folded sheet. The thermally conductive folded sheet may include sets of troughs and ridges that are separated from one another instead of equally spacing the troughs and ridges throughout the entire sheet. The bottom plate may be perforated with openings rather than being a solid sheet. The shapes of the flexible linkages and tabs on the spring clamp may be varied and yet still permit the functions of clamping and attachment as described herein. Tab and notch location may also be changed to accommodate the varying edge or slot locations on the substrates to be cooled. These and other changes can be made without departing from the spirit and the scope of the invention and without diminishing its attendant advantages. It is, therefore, intended that such changes and modifications be covered by the following claims.

We claim:

1. A heat sink comprising:
   a thermally conductive sheet folded into at least one set of alternating ridges and grooves, said sheet having a bottom formed by at least one of the grooves, wherein said thermally conductive sheet includes openings through a plurality of the ridges on top of said sheet;
   a thermally conductive plate,
   a clamp mechanism for forcing the bottom of said conductive sheet against said thermally conductive plate;
   an air moving device located above the top of said thermally conductive sheet for moving air down between the ridges and through the openings in said sheet; and
   wherein said clamp mechanism comprises a cap having an opening to accommodate said air moving device.

2. The heat sink of claim 1 further comprising a gasket for placement between the cap and a plurality of the ridges of said thermally conductive sheet.

3. A heat sinked assembly comprising:
   a thermally conductive sheet folded into at least one set of alternating ridges and grooves, said sheet having a bottom formed by a plurality of the grooves and a top formed by at least one of the ridges;
   thermally conductive means for supporting and contacting the bottom of said thermally conductive sheet;
   means for clamping said thermally conductive sheet to said thermally conductive means wherein said means for clamping comprises a cap extending over the top of said thermally conductive sheet and an appendage projecting from said cap for latching beneath an edge of said thermally conductive means; and
   a substrate to be cooled placed against said thermally conductive means opposite from said thermally conductive sheet.

4. The heat sinked assembly of claim 3 further comprising air movement means, mounted on the top of said thermally conductive sheet, for moving air through the at least one set of alternating ridges and grooves.

5. A heat sink comprising:
   a thermally conductive sheet folded into at least one set of alternating ridges and troughs, said sheet having a bottom formed by at least one of the troughs;
   a thermally conductive plate; and
   a clamp mechanism including an abutment portion for pushing said folded thermally conductive sheet against said plate, a tab for latching beneath an edge of said plate and means for clamping the plate onto a substrate to be cooled.

6. The heat sink of claim 5 wherein the abutment portion presses against the top of said thermally conductive sheet over a plurality of ridges and the tab is on an appendage coupled to the abutment portion.

7. The heat sink of claim 6 wherein said means for clamping comprises a plurality of spring clips, each having a loop for hooking.

8. The heat sink of claim 5 wherein the abutment portion comprises a plurality of members each in contact with one of the troughs for pressing down on the grooves.

9. The heat sink of claim 8 wherein the abutment portion and the tab are portions of a spring.

10. The heat sink of claim 9 wherein said means for clamping comprises a bent portion of the tab on the spring which engages the substrate to be cooled so as to hold said thermally conductive plate pressed against the substrate.

11. An active heat sink comprising:
    a thermally conductive sheet folded into at least one set of alternating ridges and grooves, said sheet having a bottom formed by a plurality of the grooves and a top formed by at least one of the ridges;
    an air moving device mounted on top of said thermally conductive sheet;
    a plate mounted in thermal contact with the bottom of said thermally conductive sheet; and
    a clamp for pressing against the top of said thermally conductive sheet and against said plate to improve thermal contact between the plurality of the grooves and said plate.

12. The active heat sink of claim 11 wherein said clamp includes a cap extending over the top of said thermally conductive sheet and having an opening in fluid communication with said air moving device.

13. The active heat sink of claim 12 wherein said clamp further includes an appendage projecting from said cap and a flange on said appendage for latching beneath an edge of said plate.

14. The active heat sink of claim 13 wherein said cap includes a top abutment within said cap for pressing against the top of said thermally conductive sheet over a plurality of said ridges.

15. The active heat sink of claim 14 further comprising a compressible gasket between the top abutment and the top of said thermally conductive sheet so that said clamp applies pressure to all ridges in the plurality of said ridges.

16. The active heat sink of claim 14 wherein the top abutment comprises a sheet arranged as a spring with an edge disposed across all of said ridges.

17. The active heat sink of claim 11 further comprising openings formed in a plurality of the ridges.

18. The active heat sink of claim 17 wherein said thermally conductive sheet forms a depressed region beneath said air moving device wherein the openings in the ridges are located between walls formed by the folded sheet that are shorter than those forming the ridges.

19. The active heat sink of claim 11 further comprising a clamp mechanism for pressing the plate against a substrate to be cooled.

20. An active heat sink comprising:
    a corrugated heat conductive sheet having a top formed by corrugations in said sheet;
    a plate beneath said corrugated sheet;
    an integral cap including a top abutment for placement on the top of said corrugated heat conductive sheet and a latch member for latching beneath said plate to clamp said corrugated sheet to said plate; and
    an air moving device mounted in said cap for placement above said corrugated heat conductive sheet for moving air through the corrugations.

21. The active heat sink of claim 20 further comprising a plurality of clips attached to the cap for clamping said heat sink onto a substrate to be cooled and for applying pressure between said plate and the substrate.

22. The active heat sink of claim 20 wherein the latch member comprises an appendage and a flange on said appendage for latching beneath an edge of said plate.

23. The active heat sink of claim 20 wherein said corrugated heat conductive sheet includes openings through the sheet on top of the sheet.

24. The active heat sink of claim 23 wherein said corrugated heat conductive sheet includes a region beneath said air moving device wherein the corrugations have sidewalls that are lower than the top of the sheet.

25. An active heat sink comprising:

a thermally conductive sheet folded into at least one set of alternating ridges and grooves, said sheet having a bottom formed by a plurality of the grooves and a top formed by at least one of the ridges;

an air moving device mounted on top of said thermally conductive sheet;

a plate mounted in thermal contact with the bottom of said thermally conductive sheet;

a clamp for forcing the plurality of grooves against the plate; and a plurality of clips attached to the clamp for clamping said heat sink onto a substrate to be cooled and for forcing said plate against the substrate.

26. The heat sink of claim 25 wherein said thermally conductive sheet includes openings through a plurality of the ridges on top of said sheet.

27. The heat sink of claim 26 wherein said air moving device moves air down between the ridges and through the openings in said sheet.

28. The heat sink of claim 25 wherein said clamp comprises a cap having an opening to accommodate said air moving device.

29. The heat sink of claim 28 wherein said cap includes a top abutment for pressing down on the ridges and a plurality of appendages each coupled at one end to the top abutment and having an opposite end for hooking onto said plate.

* * * * *